(12) United States Patent
Liu et al.

(10) Patent No.: US 12,033,958 B2
(45) Date of Patent: Jul. 9, 2024

(54) SEMICONDUCTOR DEVICE INCLUDING A SUSPENDED REINFORCING LAYER AND METHOD OF MANUFACTURING SAME

(71) Applicant: WESTERN DIGITAL TECHNOLOGIES, INC., San Jose, CA (US)

(72) Inventors: Yangming Liu, Shanghai (CN); Shenghua Huang, Shanghai (CN); Bo Yang, Milpitas, CA (US); Ning Ye, San Jose, CA (US); Cong Zhang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 138 days.

(21) Appl. No.: 17/536,800

(22) Filed: Nov. 29, 2021

(65) Prior Publication Data
US 2023/0170312 A1 Jun. 1, 2023

(51) Int. Cl.
*H01L 23/00* (2006.01)
*H01L 23/552* (2006.01)
*H01L 25/065* (2023.01)

(52) U.S. Cl.
CPC .......... *H01L 23/562* (2013.01); *H01L 23/552* (2013.01); *H01L 24/48* (2013.01); *H01L 25/0652* (2013.01); *H01L 25/0657* (2013.01); *H01L 2224/48145* (2013.01); *H01L 2224/48225* (2013.01); *H01L 2225/06506* (2013.01); *H01L 2225/0651* (2013.01); *H01L 2225/06562* (2013.01); *H01L 2924/3511* (2013.01)

(58) Field of Classification Search
CPC .......................... H01L 23/562; H01L 25/0652
See application file for complete search history.

(56) References Cited

U.S. PATENT DOCUMENTS

| | | | |
|---|---|---|---|
| 8,741,694 B1 | 6/2014 | Chen et al. | |
| 2007/0087480 A1* | 4/2007 | Tao | H01L 23/4334 257/E23.092 |
| 2010/0109169 A1 | 5/2010 | Kolan et al. | |

* cited by examiner

*Primary Examiner* — Yu-Hsi D Sun
(74) *Attorney, Agent, or Firm* — Vierra Magen Marcus LLP

(57) ABSTRACT

A semiconductor device includes a substrate, semiconductor dies on the substrate, molding compound and a reinforcing layer suspended within the molding compound. The reinforcing layer may for example be a copper foil formed in the molding compound over the semiconductor dies during the compression molding process. The reinforcing layer may have a structural rigidity which provides additional strength to the semiconductor device. The reinforcing layer may also be formed of a thermal conductor to draw heat away from a controller die within the semiconductor device.

18 Claims, 11 Drawing Sheets

SEMICONDUCTOR DEVICE INCLUDING A SUSPENDED REINFORCING LAYER AND METHOD OF MANUFACTURING SAME

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility and rugged design, along with their high reliability and large capacity, have made such memory devices ideal for use in a wide variety of electronic products, including for example digital cameras, digital music players, video game consoles, computer SSDs, PDAs and cellular telephones.

While many varied packaging configurations are known, flash memory semiconductor devices may in general be fabricated as system-in-a-package (SIP) or multichip modules (MCM), where a plurality of semiconductor die are mounted and interconnected to an upper surface of substrate. The substrate may in general include a rigid, dielectric base having a conductive layer etched on one or both sides. Solder balls are often mounted on contact pads formed on a lower surface of the substrate to allow the substrate to be soldered to a host device such as a printed circuit board. Once mounted, signals may be transferred between the semiconductor die in the package and the host device via the substrate.

There is an ever-present demand to provide greater storage capacity in a smaller overall form factor semiconductor package. One way this is done is to decrease the thickness of the semiconductor dies within the package. One shortcoming of decreasing the thickness of the semiconductor dies is that they become more fragile, and prone to cracking under mechanical stresses or shock to the semiconductor package. One source of mechanical stress within a semiconductor package is warping that may result due to different components within the package having different coefficients of thermal expansion. Warping can affect individual semiconductor packages, or an entire strip of semiconductor packages during package assembly. In addition to die cracking, warping can damage wire bonds or other electrical connections within the package, all of which can result in package or board level reliability (BLR) failure.

DETAILED DESCRIPTION

Figure 1:
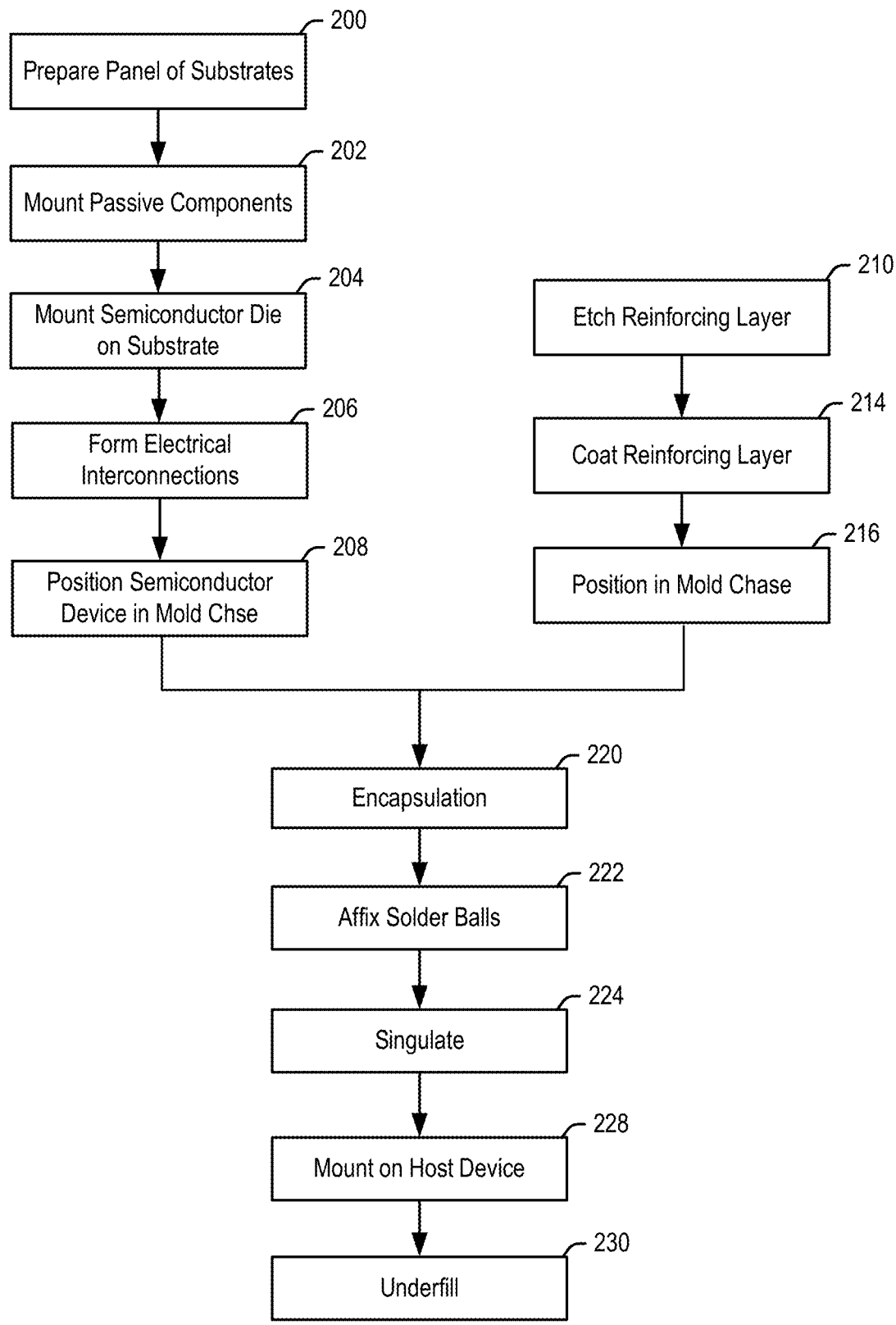
FIG. 1 is a flowchart of the overall assembly process of a semiconductor device according to embodiments of the present technology.

The present technology will now be described with reference to the figures, which in embodiments, relate to a semiconductor device including a substrate, semiconductor dies on the substrate, molding compound and a reinforcing layer suspended within the molding compound. The reinforcing layer may for example be a copper foil formed in the molding compound over the semiconductor dies during the encapsulation process. The reinforcing layer may have a structural rigidity which provides additional strength to the semiconductor device to resist mechanical stresses which could otherwise warp the semiconductor device and/or crack or damage the semiconductor dies within the device. The reinforcing layer may also be formed of a thermal conductor to draw heat away from a controller die within the semiconductor device.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 2:
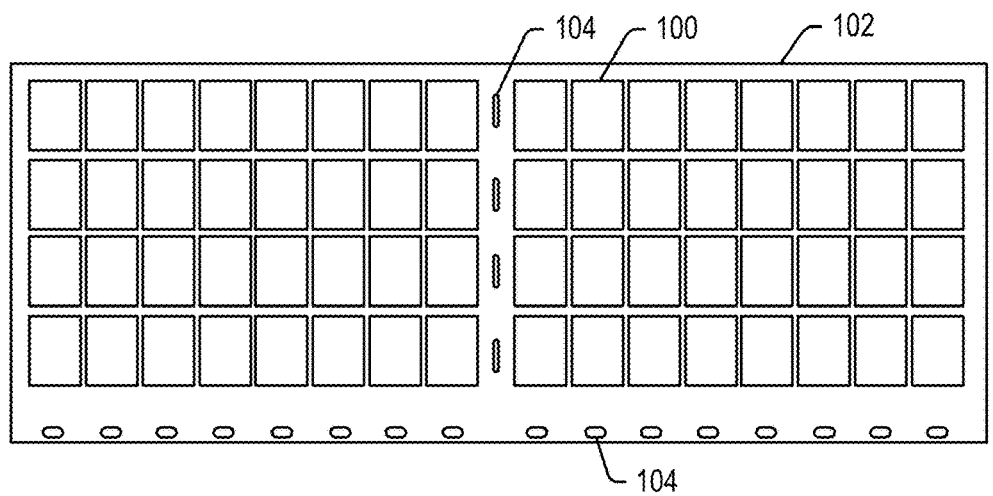
FIG. 2 is a top view of a panel of substrates used in forming semiconductor devices according to embodiments of the present technology.

An embodiment of the present technology will now be explained with reference to the flowchart of FIG. 1 and the top and side views of FIGS. 2 through 18. The assembly of semiconductor device 150 begins with a plurality of substrates 100 formed contiguously on a panel 102 in step 200 as shown in FIG. 2. FIG. 2 shows one representation of a panel 102 of substrate 100, though panel 102 may have a wide variety of other configurations and numbers of substrates 100 in further embodiments. Fiducial marks 104 are provided on the substrate panel 102 to allow machine vision alignment of the substrate panel in a processing tool. Again, the fiducial marks are by way of example only and may vary in other substrate panels.

The substrate 100 is an example of a chip carrier medium provided to transfer signals, data and/or information between one or more semiconductor dies mounted on the chip carrier medium and a host device as explained below. However, it is understood that other examples of chip carrier mediums may be used, including a printed circuit board (PCB), a leadframe or a tape automated bonded (TAB) tape. The substrate may be formed of one or more core layers, each sandwiched between two conductive layers. The conductive layers may be formed of copper or copper alloys, plated copper or plated copper alloys, Alloy 42 (42Fe/58Ni), copper plated steel, or other metals and materials suitable for use on substrate panels. The one or more core layers may be formed of various dielectric materials such as for example, polyimide laminates, epoxy resins including FR4 and FR5, bismaleimide triazine (BT), and the like. The one or more core layers may be ceramic or organic in alternative embodiments.

The two or more conductive layers may be etched into conductance patterns comprising electrical connectors. The electrical connectors may include contact pads for physically and electrically attaching different electronic components to the substrate, such as memory dies and a controller die as explained below. The electrical connectors may further include electrical traces and through-hole vias electrically interconnecting conductance patterns of the different conductive layers of substrate 100.

The substrate 100 may undergo a variety of processing steps, including solder masking, electroplating of exposed contact pads, inspection and testing. Thereafter, passive components 108 may be affixed to the substrate 100 in a step 202 as shown in the side view of FIG. 3 and the top view of FIG. 4. The one or more passive components may include for example one or more capacitors, resistors and/or inductors, though other components are contemplated. The passive components 108 shown are by way of example only, and the number, type and position may vary in further embodiments.

Figure 3:
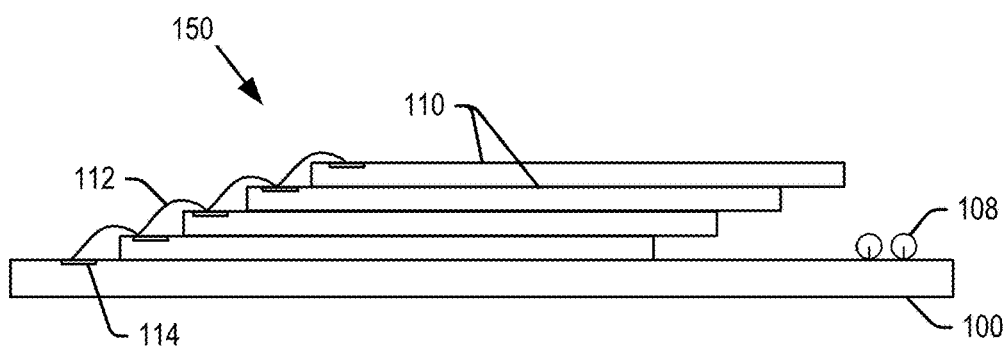
FIG. 3 is a side view of a semiconductor device during assembly according to an embodiment of the present technology.
Figure 4:
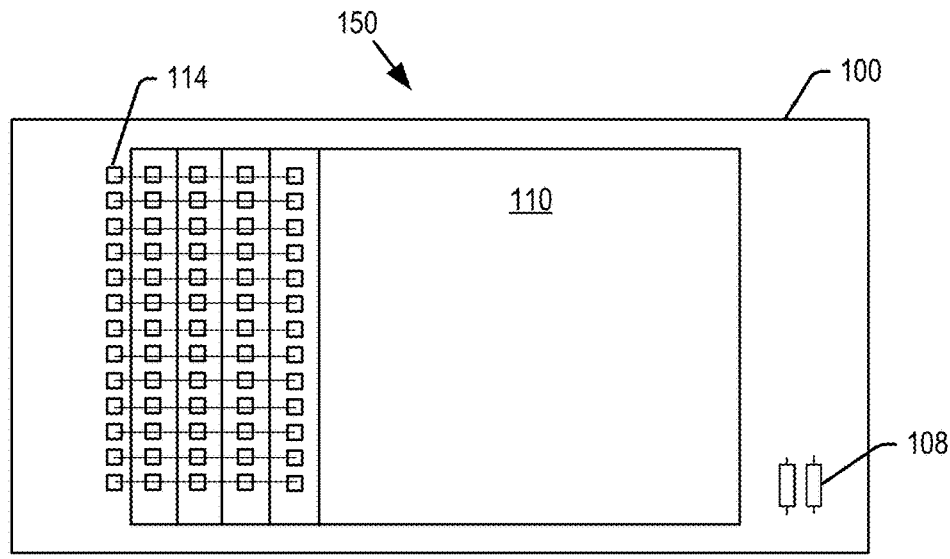
FIG. 4 is a top view of the semiconductor device shown in FIG. 3.

In step 204, one or more semiconductor dies may be mounted on the substrate 100. For example, FIGS. 3 and 4 show semiconductor memory dies 110 stacked on substrate 100. The semiconductor memory dies 110 may for example be 2D NAND flash memory or 3D BiCS (Bit Cost Scaling), V-NAND or other 3D flash memory, but other types of dies 110 may be used. These other types of semiconductor die include but are not limited to RAM such as an SDRAM, DDR SDRAM, LPDDR and GDDR. In further embodiments explained below, a controller die such as an ASIC may also be mounted on the substrate 100.

Where multiple semiconductor memory dies 110 are included, the semiconductor dies 110 may be stacked atop each other in an offset stepped configuration to form a die stack. The number of dies 110 shown in the stack is by way of example only, and embodiments may include different numbers of semiconductor dies, including for example 1, 2, 4, 8, 16, 32 or 64 die. There may be other numbers of dies in further embodiments. The one or more dies may be affixed to the substrate and/or each other using a die attach film. As one example, the die attach film may be cured to a B-stage to preliminarily affix the die 110 in the stack, and subsequently cured to a final C-stage to permanently affix the die 110 to the substrate 100.

In step 206, the semiconductor dies 110 may be electrically interconnected to each other and to the substrate 100. FIGS. 3 and 4 show side and top views of bond wires 112 being formed between corresponding die bond pads on respective dies 110 down the stack, and then bonded to contact pads 114 on a surface of substrate 100. The wires 112 may be bonded by a ball-bonding technique, but other wire bonding techniques are possible. The semiconductor dies 110 may be electrically interconnected to each other and the substrate 100 by other methods in further embodiments, including by through-silicon vias (TSVs) or flip-chip bonding.

FIGS. 3 and 4 show a semiconductor device 150 during assembly. Before, during or after assembly of the semiconductor device 150 shown in FIGS. 3 and 4, a reinforcing layer 120 may be formed in steps 210 and 214, and placed in a mold chase in step 216. In embodiments, the reinforcing layer may be a copper foil having a thickness of 10 μm to 50 μm, though the reinforcing layer 120 may be formed of other materials and other thicknesses in further embodiments. In further examples, the reinforcing layer 120 may be formed of other metals, such as aluminum, or alloys including copper and/or aluminum.

The reinforcing layer functions to add strength and rigidity to the semiconductor device 150 during the encapsulation process and in the completed semiconductor device 150. The material and thickness of reinforcing layer 120 may be selected depending on the degree of strength and rigidity desired in the semiconductor package. The reinforcing material may be thermally and/or electrically conductive, though it need not be in further embodiments.

Formation of the reinforcing layer 120 includes the step 210 of etching or otherwise forming the reinforcing layer 120 to the desired shape as explained below, and coating the reinforcing layer in step 214. The coating 122 (FIG. 6) of reinforcing layer 120 may be a polymer 122, such as for example any of various acrylics, epoxies, polyurethanes, silicones, polyimides, fluorocarbons, benzocyclobutenes (BCB), and p-polyxylylenes. The coating 122 may be applied in any of various thin film deposition processes. The coating 122 may be provided to prevent oxidization and enhance adhesion with molding compound as explained below. The coating 122 may be omitted in further embodiments.

Figure 5:
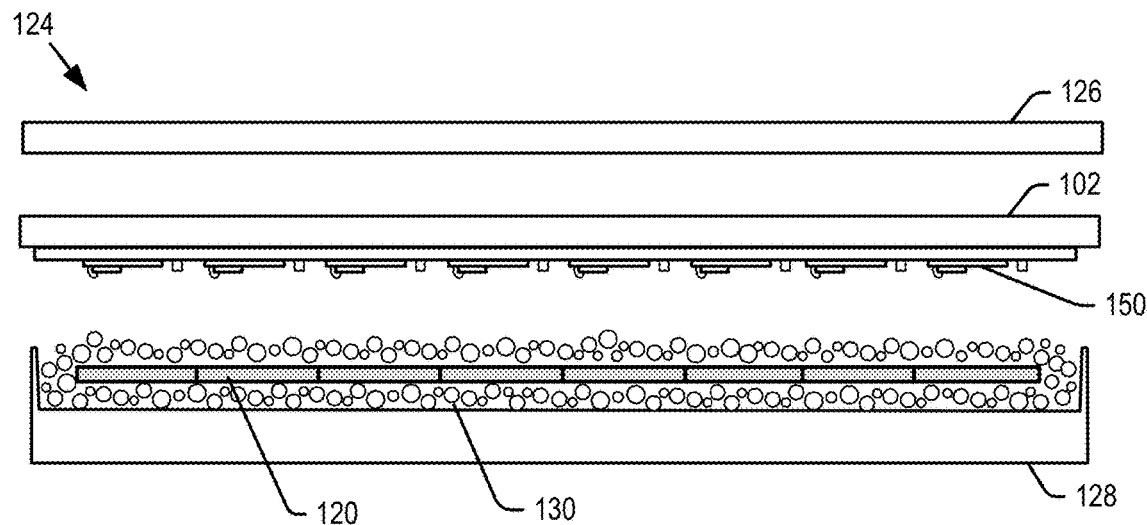
FIG. 5 is a side view of a panel of semiconductor devices positioned within a mold chase according to an embodiment of the present technology.

The semiconductor devices 150 on panel 102 may be encapsulated in molding compound 130 together with the reinforcing layer 120 in a mold chase 124 in step 220. FIG. 5 shows the reinforcing layer 120 positioned in the mold chase 124 including top and bottom mold plates 126 and 128. The reinforcing layer 120 may be positioned in the bottom mold plate 128 together with the uncured molding compound 130, which may for example be epoxy resin, Phenol resin, fused silica, crystalline silica, carbon black and/or metal hydroxide. Other molding compounds are contemplated.

When first placed in the mold chase 124, the uncured molding compound may be in powder or particle form. The reinforcing layer 120 may be placed in the bottom mold plate 128 so as to be covered on both its first and second major surfaces with the uncured molding compound. Once the molding compound is cured or hardened, the reinforcing layer 120 may be suspended in the molding compound, beneath the surface of the molding compound. That is, the reinforcing layer is spaced above the semiconductor dies within the semiconductor device 150, surrounded on all sides by the molding compound.

In one example, the reinforcing layer 120 may be covered with molding compound 130 so that, once cured, the reinforcing layer 120 is spaced 3 µm to 10 µm from an upper surface of the one or more semiconductor dies 110. The reinforcing layer 120 may be spaced a smaller or greater distance from an upper surface of the semiconductor dies 110 in further embodiments. The reinforcing layer 120 may have an area large enough to cover each of the semiconductor devices 150 on panel 102. The bond wires 112 may extend above (below from the perspective of FIG. 5) the surface of the dies 110, but the reinforcing layer 120 may be formed with a keep-out window over the bond wires 112 as explained below.

Once the reinforcing layer 120 and the semiconductor devices 150 on panel 102 are placed within the mold chase 124, the upper and lower mold plates 126, 128 may be sealed together, and the molding compound 130 cured under heat and pressure. The heat liquifies the molding compound, and the pressure ensures that the molding compound is forced into contact with all exposed areas on the reinforcing layer 120 and the semiconductor devices 150. Upon completion of step 220, the encapsulated panel of semiconductor devices may be removed from the mold chase 124 and cooled.

Figure 6:
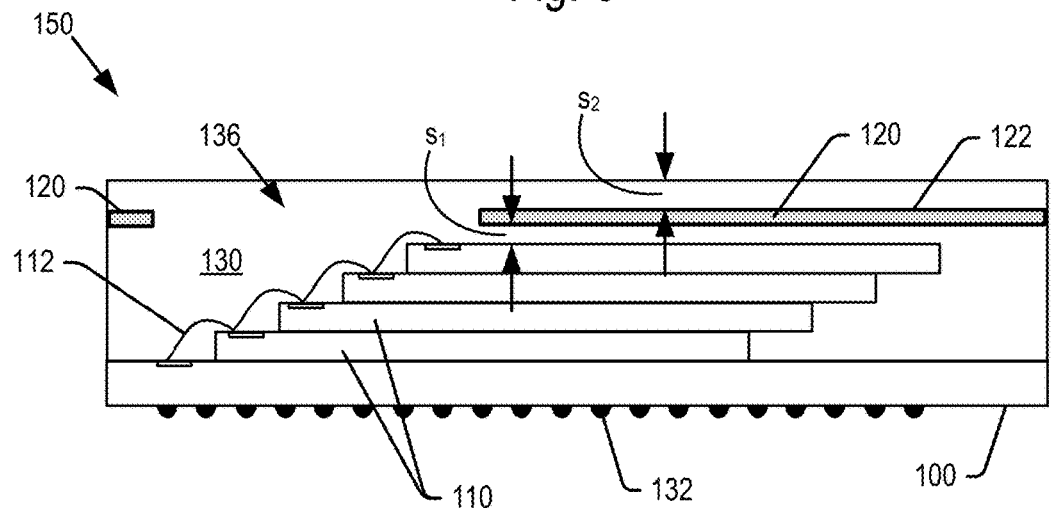
FIG. 6 is a side view of a semiconductor device including a reinforcing layer according to an embodiment of the present technology.

In step 222, solder balls 132 may be affixed to contact pads on a lower surface of substrate 100 as shown in the side view of FIG. 6. The solder balls 132 may be used to solder the semiconductor device 150 to a host device, such as a printed circuit board, as explained below. The pattern solder balls 132 shown on the bottom surface of substrate 100 in FIG. 6 is by way of example only, and may vary in further embodiments.

After formation and encapsulation of the semiconductor devices 150, the semiconductor devices 150 may be singulated from each other in step 224 to form individual finished semiconductor devices 150, such as the one shown in FIG. 6. The semiconductor devices 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 150, it is understood that semiconductor device 150 may have shapes other than rectangular and square in further embodiments of the present technology.

FIG. 6 shows a side view of the reinforcing layer 120 positioned over the semiconductor memory dies 110, and beneath a surface of the molding compound 130. As noted above, in embodiments, the reinforcing layer 120 may have a spacing, $S_1$, that is 3 µm to 10 µm from an upper surface of the one or more semiconductor dies 110, though this spacing $S_1$ may be lesser or greater than that in further embodiments. The reinforcing layer 120 may have a spacing, $s_2$, that is 5 µm to 10 µm from an upper surface of the molding compound 130, though this spacing $s_2$ may be lesser or greater than that in further embodiments.

Figure 7:
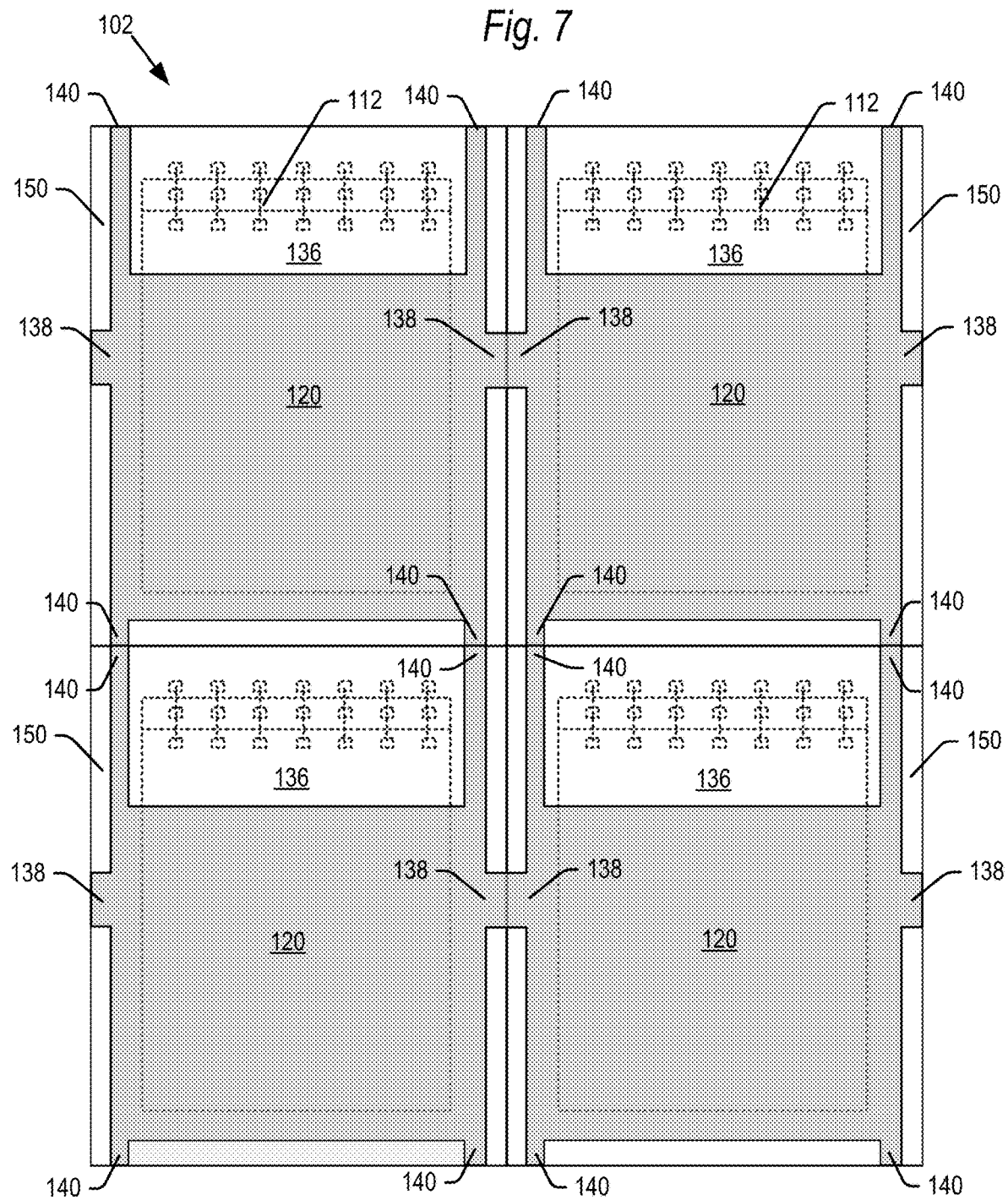
FIG. 7 is a top view of a reinforcing layer across a number of semiconductor devices on a panel of semiconductor devices according to an embodiment of the present technology.

As noted above, the bond wires 112 may extend above the upper surface of the top semiconductor die 110 in the die stack. In order to allow the reinforcing layer 120 to be placed closely to the one or more semiconductor dies 110 while ensuring no contact between the bond wires 112 and the reinforcing layer 120, the reinforcing layer 120 may be formed with an opening, or keep-out window, 136 as shown in the side view of FIG. 6 and the top view of a portion of panel 102 and reinforcing layer 120 shown in FIG. 7. FIG. 7 shows four semiconductor devices 150 of panel 102, covered by the reinforcing layer 120 (shown shaded in FIG. 7).

As noted, the reinforcing layer 120 may extend over each semiconductor device 150 on panel 102. The position of the bond wires 112 for each device 150 on panel 102 is known. Using this information, the keep-out window 136 may be etched, or otherwise formed, in the reinforcing layer 120 in advance so that, when the reinforcing layer 120 is positioned in the mold chase, the keep-out window 136 overlies the bond wires 112 in each semiconductor device 150. The reinforcing layer 120 may include fiducial marks or tabs (not shown) to ensure proper lateral and longitudinal positioning of the reinforcing layer within the mold chase 124 relative to the semiconductor devices 150 in panel 102. The size of the keep-out window may vary to leave a greater or smaller margin around the bond wires 112. In embodiments described below, the bond wires 112 may extend into the keep-out window 136. That is, the uppermost portions of the bond wires 112 may extend to a height above the substrate 100 that is greater than a height of the reinforcing layer 120 above the substrate 100. In further embodiments, the height of the reinforcing layer 120 above the substrate may be greater than or equal to a height of the uppermost portions of the bond wires 112 above the substrate 100.

The reinforcing layer 120 may include separation tabs 138 at the sides of each semiconductor device 150, and separation tabs 140 at the front/rear edges of each semiconductor device 150. These tabs get cut during the singulation step 224 when the individual devices 150 are separated from panel 102. The keep-out window 136 can define the separation tabs 140 at the front and rear edges of adjoining semiconductor devices 150.

Figure 8:
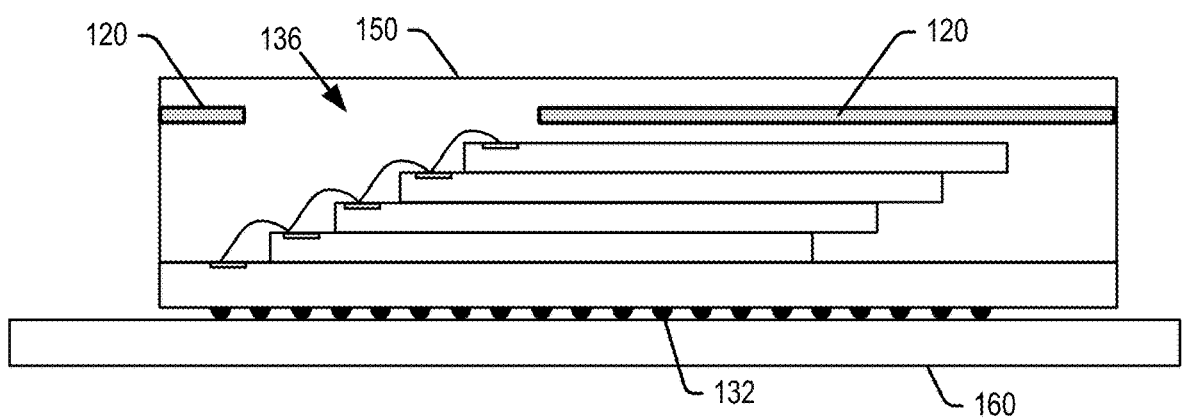
FIG. 8 is a side view of a semiconductor device mounted on a host device printed circuit board according to an embodiment of the present technology.

In step 228, a finished semiconductor device 150 may be mounted on a host device 160, such as a printed circuit board, as shown in the side view of FIG. 8. Solder balls 132 may be reflowed to physically and electrically connect the semiconductor device 150 to the host device 160. Optionally, an underfill step 230 may be performed to fill any space between the semiconductor device 150 and the PCB 160.

Figure 9:
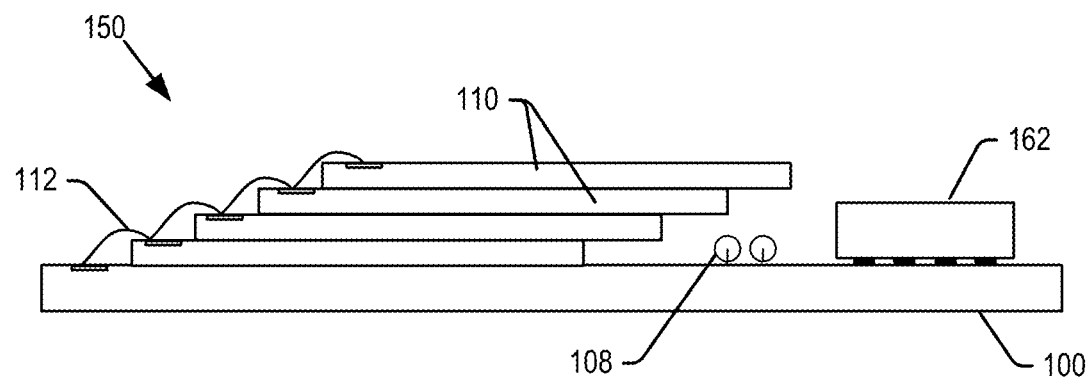
FIG. 9 is a side view of a semiconductor device during assembly according to an alternative embodiment of the present technology.
Figure 10:
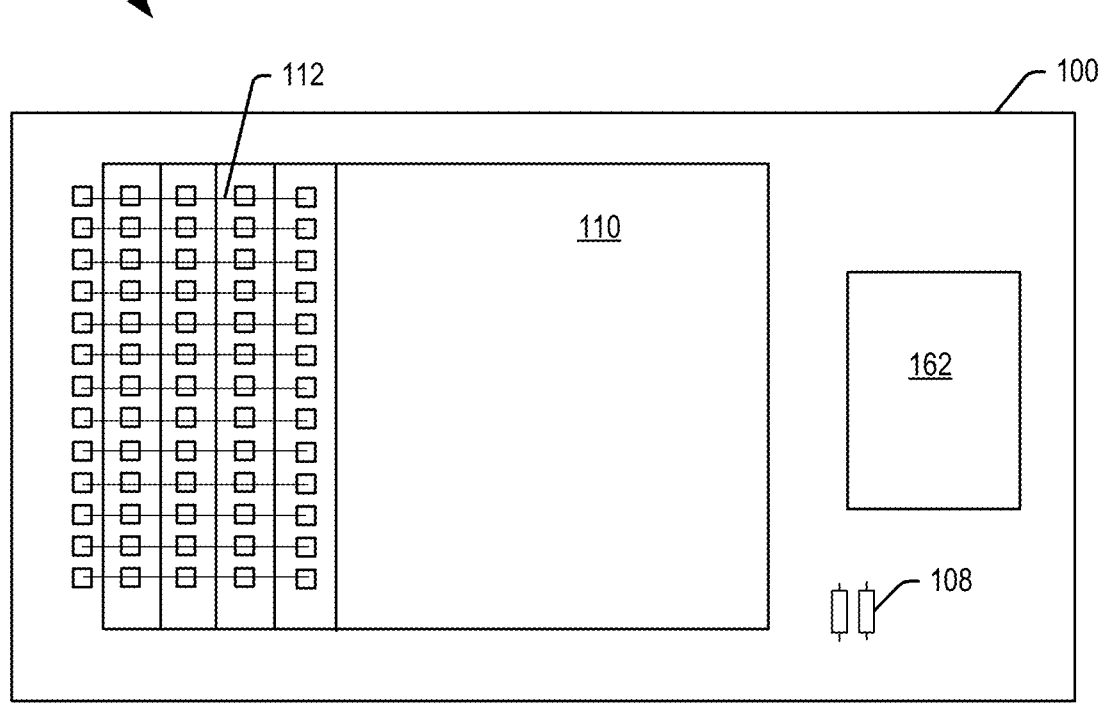
FIG. 10 is a top view of the semiconductor device shown in FIG. 9.

As noted above, in embodiments, the semiconductor device 150 may further include a controller, such as for example an ASIC for controlling the flow of data and information between the one or more memory dies 110 and host device 160. Referring now to the side and top views of FIGS. 9 and 10, there is shown a semiconductor device 150 as described above, and further including a controller semiconductor die 162 mounted to the substrate 100. In FIGS. 9 and 10, components having the same reference numbers as above may be structurally and operationally identical to those components described above. The controller 162 is shown surface mounted to the substrate 100 as by flip-chip bonding, but the controller 162 may be coupled to the substrate by other methods including using bond wires.

Using the above-described steps, the semiconductor device 150 shown in FIGS. 9 and 10 including controller 162 may be encapsulated in molding compound including the reinforcing layer 120, possibly also including a coating 122. Such an encapsulated semiconductor device 150 is shown in the side view of FIGS. 11A and 11B. As described above, the reinforcing layer 120 adds strength and rigidity semiconductor device 150 shown in FIGS. 11A and 11B. The amount of strength and rigidity added by reinforcing layer 120 may be customized as needed by selecting different materials and/or thicknesses of reinforcing layer 120.

Figure 11A:
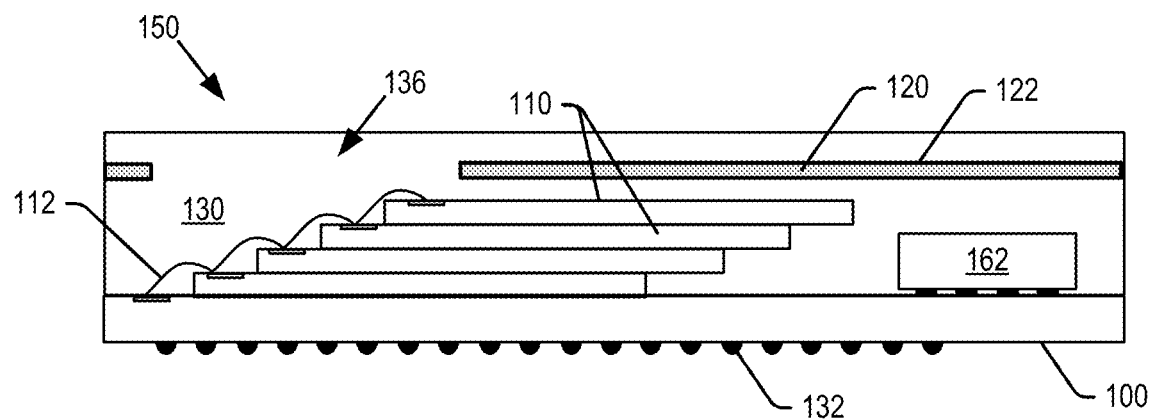
FIGS. 11A and 11B are side views of a semiconductor device including a reinforcing layer and a keep-out window according to an alternative embodiment of the present technology.
Figure 11B:
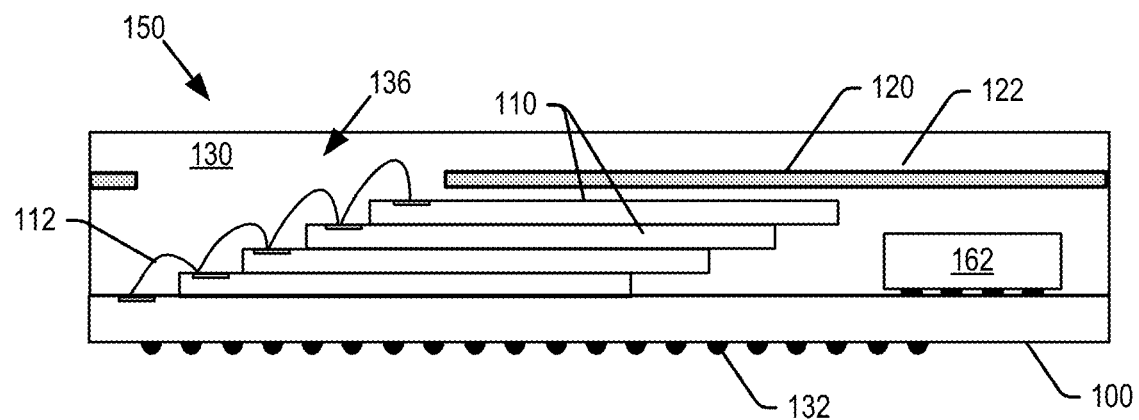
Figure 12:
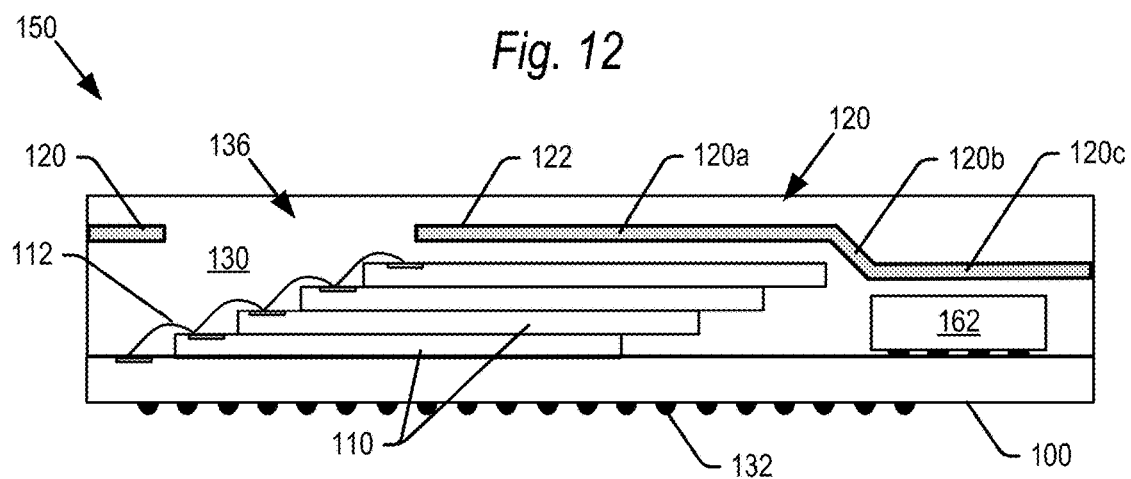
FIG. 12 is a side view of a semiconductor device including a reinforcing layer according to a further alternative embodiment of the present technology.
Figure 13:
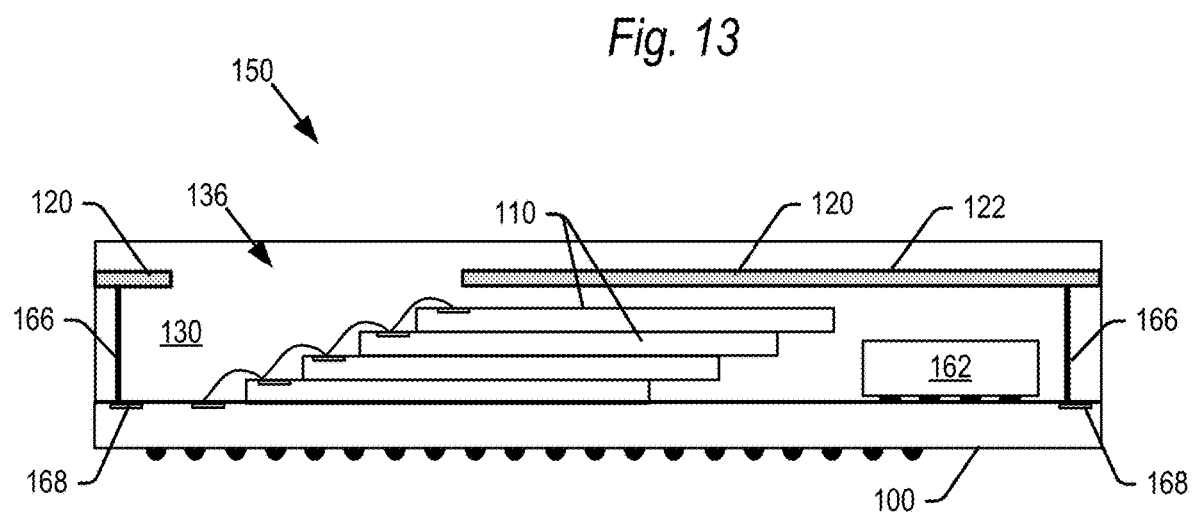
FIG. 13 is a side view of a semiconductor device including a reinforcing layer according to a still further alternative embodiment of the present technology.

As noted above, the reinforcing layer 120 may be positioned in the mold chase 124 so that, upon encapsulation, the keep-out window 136 is positioned over the bond wires 112. As noted, the reinforcing layer 120 may be positioned within the mold chase 124 so that, upon encapsulation, the reinforcing layer 120 and keep-out window are above an uppermost position of the bond wires 112, as shown in FIG. 11A. Alternatively, the reinforcing layer 120 may be positioned within the mold chase 124 so that, upon encapsulation, the reinforcing layer 120 is closer to the semiconductor dies 110 and 162. In such embodiments, an uppermost position of the bond wires 112 may extend into and/or through the keep-out window 136, as shown in FIG. 11B.

It is known that controller semiconductor dies generate large amounts of heat, especially when operating at the higher frequencies of present-day memory devices. In embodiments, it is a further feature of the reinforcing layer 120 to draw heat away from the controller die 162, and spread that heat throughout the semiconductor device 150, whereupon the heat may be dissipated through an upper surface of the molding compound 130 and/or through the solder balls 132 to a host device such as PCB 160 shown in FIG. 8. Further details of the ability of reinforcing layer 120 to draw heat away from controller 162, and spread that heat through semiconductor device 150 for dissipation is described below with reference to the heat maps of FIGS. 14 and 15.

In the embodiments shown in FIG. 11 and described above, the reinforcing layer 120 may be a flat planar sheet. This sheet is effective in adding strength and rigidity and, in embodiments, drawing heat away from the controller die 162. However, in a further embodiment shown in the side view of FIG. 12, the reinforcing layer 120 within each semiconductor device 150 may include first and second flat planar sections 120a and 120c generally parallel to surfaces of the memory dies 110 and controller die 162, and a flat angled section 120b connected between the first and second planar sections 120a and 120c. "Angled" as used here means some non-zero angle, so that the angled section 120b is not parallel to sections 120a and/or 120c. In embodiments, the stack of memory dies 110 may extend higher than the controller die 162 as shown for example in FIG. 12. In such embodiments, providing an angled section 120b in the reinforcing layer allows the section 120c to rest closer to the controller die 162, and thus better able to draw heat away from the controller die.

The angle of the angled section 120b may be set based on the height of the stack of memory dies 110 as compared to the height of the controller die 162. In embodiments, the angled section 120b allows the section 120a to be between 3 μm and 10 μm above an upper surface of the one or more semiconductor dies 110, and allows the section 120c to be between 3 μm and 10 μm above an upper surface of the controller die 162. These heights of sections 120a and 120c above dies 110 and 162 are by way of example only, and each may be greater or lesser in further embodiments.

In embodiments, in addition to adding strength, rigidity and heat conduction, the reinforcing layer 120 may further provide a shield to reflect and/or absorb EMI (electromagnetic interference) and RFI (radio frequency interference). Such an embodiment will now be described with reference to the side view of FIG. 13. Here, electrically conductive columns may be formed which extend from grounded contact pads 168 on the substrate 100 up into contact with the reinforcing layer 120. In embodiments, the columns 166 may comprise plated or filled vias formed by initially etching, drilling, lasing or otherwise forming holes through the reinforcing layer 120 and molding compound 130, down to the contact pads 168 on the substrate 100.

The columns 166 may be formed by other methods in further embodiments. In one such further embodiment, before the molding compound is formed in step 220, conductive columns may be affixed, as by soldering, onto the grounded contact pads 168. The conductive columns may be formed for example of copper, and may extend to a height above the substrate so that, when the semiconductor device 150 is positioned in the mold chase 124, the conductive columns rest in contact with the reinforcing layer 120. Using this scheme, the grounded reinforcing layer can provide protection against both EMI and RFI. The number and positions of columns 166 may vary in different embodiments.

Figure 14:
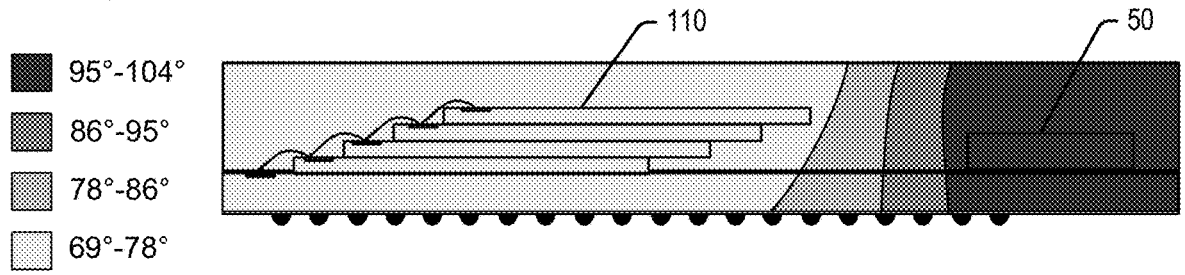
FIG. 14 is a heat map of a conventional semiconductor package.
Figure 15:
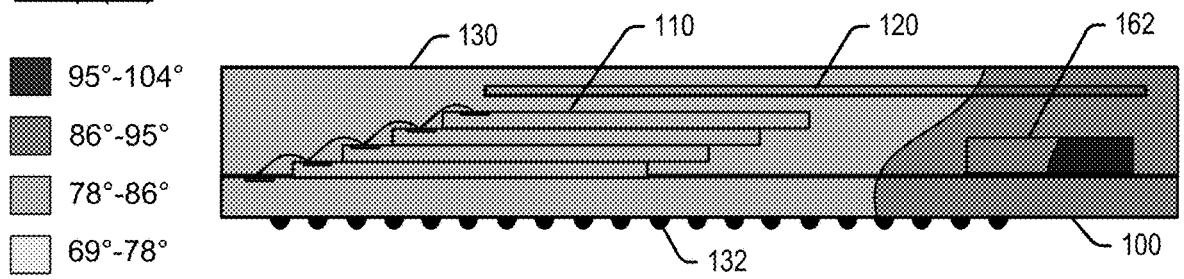
FIG. 15 is a heat map of a semiconductor device according to embodiments of the present technology.

FIG. 14 is a prior art heat map showing temperature gradients within a conventional semiconductor package, and FIG. 15 is a heat map showing temperature gradients within semiconductor device 150 of the present technology. FIG. 14, shows a conventional semiconductor package 50 including memory dies 52 and controller die 54. As shown, the heat generated by the controller die 54 remains localized at the controller die. This excessive heat can slow down read/write operations and cause failure of the controller die 54 and semiconductor package 50.

Referring now to the heat map of FIG. 15, according to aspects of the present technology, the reinforcing layer 120 is effective in drawing heat away from the controller die 162, and spreading that heat throughout the semiconductor device 150. In this way, the controller die 162 remains cool and optimally functional. From the device 150, heat is conducted away to the host device (not shown in FIG. 15) through the solder balls 132. Heat may also be dissipated through the molding compound 130 to the environment surrounding the semiconductor device 150.

Figure 16:
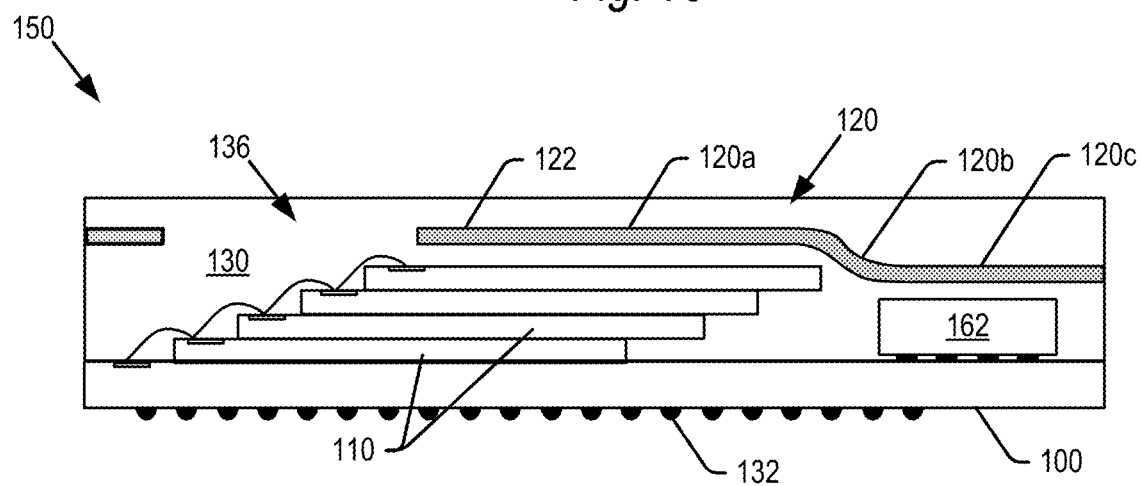
FIGS. 16-18 are side and top views of semiconductor devices including alternative configurations of reinforcing layers according to further embodiments of the present technology.
Figure 17:
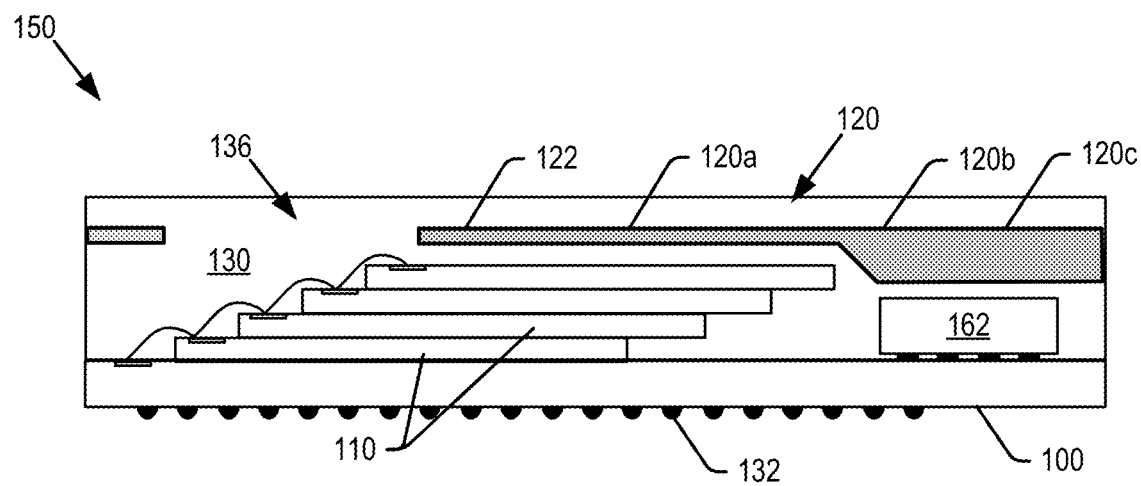
Figure 18:
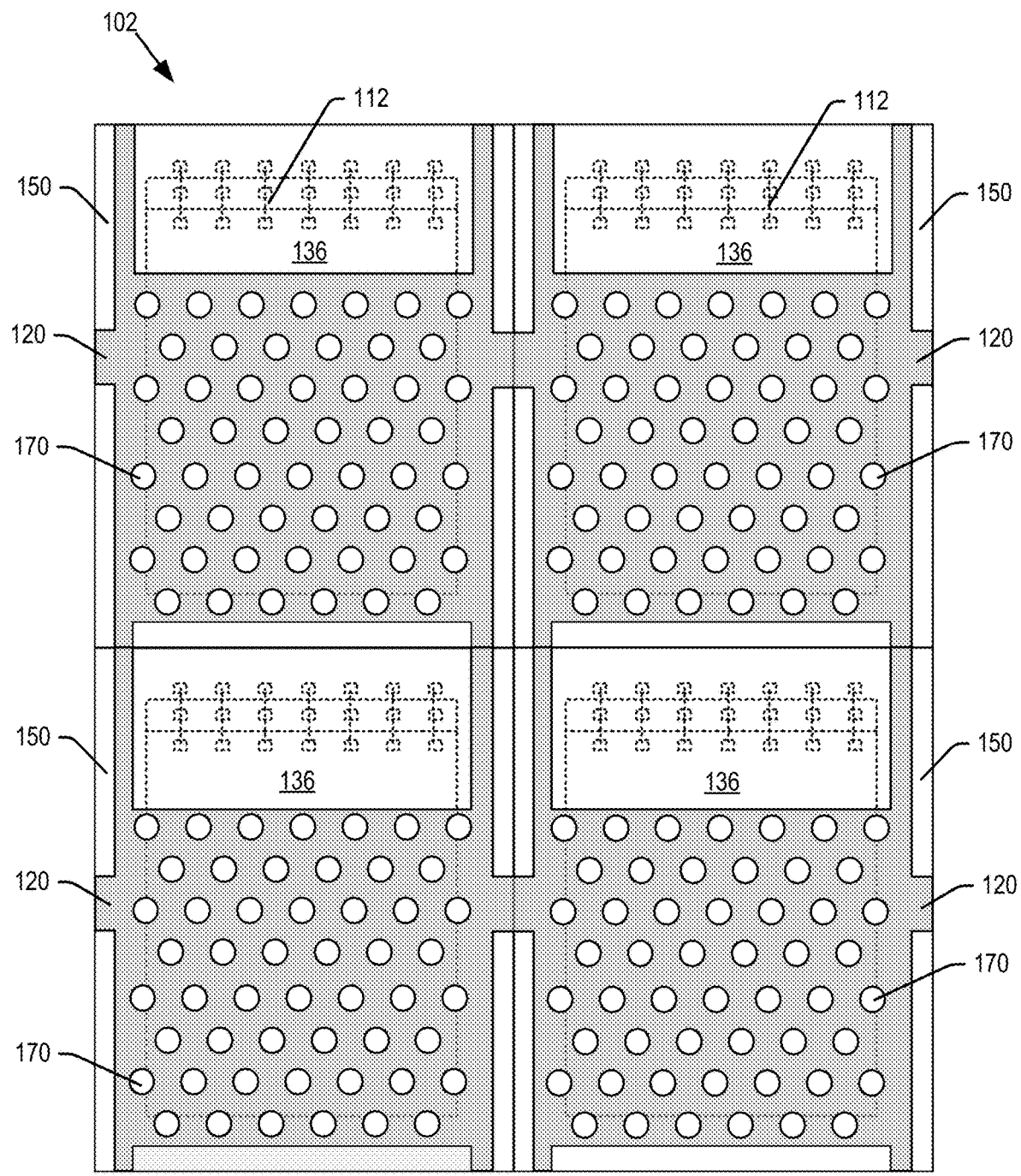

FIGS. 16-18 are side and top views of alternative embodiments of a reinforcing layer 120. FIG. 16 is similar to the embodiment shown in FIG. 12. However, instead of having flat planar sections, the sections are curved. In embodiments described above, the reinforcing layer is of uniform thickness along its length and across its width. In the embodiment of FIG. 17, the reinforcing layer 120 may have different thicknesses along its length. In the embodiment shown, the reinforcing layer is thicker over the controller die 162 than it is over the memory dies 110. A thicker section over the controller die may be more effective at removing heat from the controller die. It is understood that the reinforcing layer may have different thickness at other portions of its length and/or width in further embodiments. FIG. 18 is a top view showing a reinforcing layer 120 as in FIG. 7, but in the embodiment of FIG. 18, the reinforcing layer 120 is provided with openings 170 (in addition to keep-out window 136). In the embodiment shown, the openings 170 are circular, but they may be a wide variety of regular or irregular shapes in further embodiments.

In summary, in one example, the present technology relates to a semiconductor device, comprising: a substrate; one or more semiconductor dies mounted on a surface of the substrate; bond wires electrically coupling the one or more semiconductor dies to the substrate; molding compound encapsulating the one or more semiconductor dies and bond wires; and a reinforcing layer, suspended in the molding compound beneath a surface of the molding compound and above a surface of the one or more semiconductor dies, the reinforcing layer comprising a keep-out window above the bond wires, the reinforcing layer configured to add strength and rigidity to the semiconductor device.

In another example, the present technology relates to a semiconductor device, comprising: a substrate; one or more memory dies mounted on a surface of the substrate, the one or more memory dies extending a first height above the substrate; a controller die mounted on the surface of the substrate, next to the one or more memory dies, the controller die extending a second height above the substrate, the second height being less than the first height; molding compound encapsulating the semiconductor device; and a reinforcing layer, suspended in the molding compound beneath a surface of the molding compound and above the one or more memory dies and controller die, the reinforcing layer configured to add strength and rigidity to the semiconductor device, and the reinforcing layer comprising: a first section spaced a first distance over the one or more memory dies; a second section spaced a second distance over the controller die; and a third section, angled with respect to the first and second sections and connected between the first and second sections.

In a further example, the present technology relates to a semiconductor device, comprising: a substrate; one or more semiconductor dies mounted on a surface of the substrate; bond wires electrically coupling the one or more semiconductor dies to the substrate; molding compound encapsulating the one or more semiconductor dies and bond wires; and means for reinforcing the semiconductor device suspended in the molding compound beneath a surface of the molding compound and above a surface of the one or more semiconductor dies, the reinforcing means comprising a keep-out window above the bond wires.

In another example, the present technology relates to a method of assembling a semiconductor device, the method comprising: (a) positioning molding compound in a mold chase; (b) positioning a reinforcing layer in the molding compound in the mold chase; (c) positioning one or more semiconductor dies, mounted on a substrate, in the mold chase; (d) encapsulating the one or more semiconductor dies and the reinforcing layer in the molding compound.

In the above example, the present technology may further include heating the molding compound under pressure during said step (d) of encapsulating the one or more semiconductor dies and the reinforcing layer in the molding compound.

In the above example, the present technology may further include burying the reinforcing layer in the molding compound during said step (b) of positioning the reinforcing layer in the molding compound in the mold chase so that the reinforcing layer is suspended over the one or more semiconductor dies, beneath a surface of the molding compound, after said step (d) of encapsulating the one or more semiconductor dies and the reinforcing layer in the molding compound.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate;
   one or more semiconductor dies mounted on a surface of the substrate;
   bond wires electrically coupling the one or more semiconductor dies to the substrate;
   molding compound encapsulating the one or more semiconductor dies and bond wires; and
   a reinforcing layer comprising a polymer, the reinforcing layer suspended in the molding compound beneath a surface of the molding compound and above a surface of the one or more semiconductor dies, the reinforcing layer comprising a keep-out window above the bond wires, the reinforcing layer configured to add strength and rigidity to the semiconductor device.

2. The semiconductor device of claim 1, wherein the reinforcing layer is further configured to conduct heat away from the one or more semiconductor dies.

3. The semiconductor device of claim 1, wherein the reinforcing layer is further configured to shield the semiconductor device against at least one of electromagnetic interference and radio frequency interference.

4. The semiconductor device of claim 1, wherein the one or more semiconductor dies comprise one or more memory dies.

5. The semiconductor device of claim 4, wherein the one or more semiconductor dies comprise a controller die surface mounted to the substrate next to the one or more memory dies.

6. The semiconductor device of claim 5, wherein the reinforcing layer is a flat planar layer over the one or more memory dies and the controller die.

7. The semiconductor device of claim 5, wherein the one or more memory dies extend above the substrate more than does the controller die, and wherein the reinforcing layer comprises:
   a first section spaced a first distance over the one or more memory dies;
   a second section spaced a second distance over the controller die; and
   a third section, angled with respect to the first and second sections and connected between the first and second sections.

8. The semiconductor device of claim 7, wherein the first spacing of the first section above the one or more semiconductor dies is equal to the second spacing of the second section above the controller die.

9. The semiconductor device of claim 7, wherein at least one of the first, second and third sections are flat planar sections.

10. The semiconductor device of claim 1, wherein the reinforcing layer has a different thickness across at least one of its length and width.

11. The semiconductor device of claim 1, wherein the reinforcing layer further comprises a plurality of openings across its length and width.

12. A semiconductor device, comprising:
a substrate;
one or more memory dies mounted on a surface of the substrate, the one or more memory dies extending a first height above the substrate;
a controller die mounted on the surface of the substrate, next to the one or more memory dies, the controller die extending a second height above the substrate, the second height being less than the first height;
molding compound encapsulating the semiconductor device; and
a reinforcing layer, suspended in the molding compound beneath a surface of the molding compound and above the one or more memory dies and controller die, the reinforcing layer configured to add strength and rigidity to the semiconductor device, and the reinforcing layer comprising:
a first section spaced a first distance over the one or more memory dies;
a second section spaced a second distance over the controller die; and
a third section, angled with respect to the first and second sections and connected between the first and second sections;
wherein the first distance of the first section above the one or more memory dies is equal to the second distance of the second section above the controller die.

13. The semiconductor device of claim 12, wherein reinforcing layer is formed of copper.

14. The semiconductor device of claim 12, wherein the reinforcing layer is formed of a metal configured to add strength and rigidity to the plurality of semiconductor devices, conduct heat away from the plurality of semiconductor devices and shield the plurality of semiconductor devices against electromagnetic interference.

15. The semiconductor device of claim 12, further comprising bond wires extending between die bond pads of the one or more memory dies and the substrate.

16. The semiconductor device of claim 15, wherein the reinforcing layer further comprises a keep-out window positioned over the bond wires.

17. The semiconductor device of claim 16, wherein the bond wires extend into the keep-out window.

18. A semiconductor device, comprising:
a substrate;
one or more semiconductor dies mounted on a surface of the substrate;
bond wires electrically coupling the one or more semiconductor dies to the substrate;
molding compound encapsulating the one or more semiconductor dies and bond wires; and
means for reinforcing the semiconductor device suspended in the molding compound beneath a surface of the molding compound, the reinforcing means comprised of a polymer and including a first section positioned above a surface of the one or more semiconductor dies, and the reinforcing means comprising a keep-out window distinct from the first section above the bond wires.

* * * * *